United States Patent [19]

Ray

[11] Patent Number: 4,669,175
[45] Date of Patent: Jun. 2, 1987

[54] FRONT-TO-BACK ALIGNMENT PROCEDURE FOR BURRUS LED'S

[75] Inventor: Sankar Ray, Bloomington, Minn.

[73] Assignee: Honeywell Inc., Minneapolis, Minn.

[21] Appl. No.: 803,181

[22] Filed: Dec. 2, 1985

[51] Int. Cl.⁴ .................. H01L 21/302; H01L 21/312
[52] U.S. Cl. ..................................... 29/569 L; 29/578; 29/580; 29/590; 156/656; 156/657; 156/659.1; 148/DIG. 102
[58] Field of Search ...................... 29/569 L, 578, 580, 29/590; 148/DIG. 102; 156/644, 656, 657, 659.1, 661.1, 660

[56] References Cited

U.S. PATENT DOCUMENTS

| | | | |
|---|---|---|---|
| 4,249,967 | 2/1981 | Liu et al. | 148/171 |
| 4,342,148 | 8/1982 | Springthorpe et al. | 29/569 L |
| 4,536,469 | 8/1985 | Adlerstein | 29/591 X |

FOREIGN PATENT DOCUMENTS

| | | | |
|---|---|---|---|
| 0121885 | 7/1984 | Japan | 29/569 L |
| 0105282 | 6/1985 | Japan | 29/569 L |

*Primary Examiner*—Olik Chaudhuri
*Attorney, Agent, or Firm*—Omund R. Dahle

[57] ABSTRACT

A method for accurate front-to-back alignment of patterns onto a wafer for fabrication of multiple Burrus LED's. The front surface of the wafer has on it epitaxial layers, a dielectric layer and a metallization layer. The metallization layer includes perpendicular alignment indicia which intersect at metal contacts of the front surface of the wafer. The perimeter of the wafer is etched away to reveal the alignment indicia which when thus exposed are visible from the back side of the wafer. The exposed indicia is used to align holes in the backside metal contact to the metal contacts on the front surface.

8 Claims, 11 Drawing Figures

FRONT-TO-BACK ALIGNMENT PROCEDURE FOR BURRUS LED'S

BACKGROUND AND SUMMARY OF THE INVENTON

This invention is directed to a method for accurate front-to-back alignment of patterns onto a wafer, particularly in the fabrication of surface emitting device such as LED's or lasers. Where fiber optic coupling to the LED is required the most successful scheme for 1.3 um surface emitting LED is the Burrus structure. In this LED structure the high intensity light generated in the epitaxial layers under the top ohmic contact (25-50 microns diameter) is emitted through a hole (125 microns diameter) in the metal contact on the back surface, thus providing a well defined narrow beam with vastly improved fiber coupling efficiency. The substrate is transparent to the emitted light, and the hole in the back surface is accurately aligned to be concentric with the metal contact on the top surface.

Conventionally alignment of a pattern on the bottom surface of a wafer to one on the top surface, i.e. front-to-back alignment, is done with either an infrared mask aligner for aligning through the substrate, or by requiring the wafer to have straight edges and using the straight edges of the wafer as references for both top and bottom patterns.

In applicant's invention an arbitrarily shaped wafer can be accurately aligned without an infrared aligner. In this method specially designed alignment markers which are part of the metallization on the front side of the wafer are exposed by etching away a small area along the edge of the wafer. The backside pattern is then directly aligned to the frontside pattern using these markers.

DESCRIPTION

Figure 1:
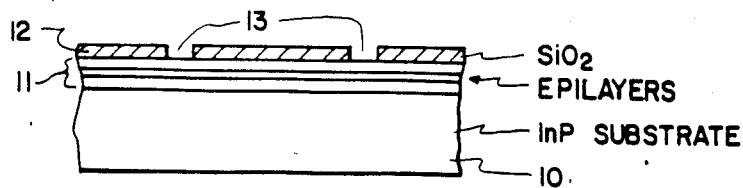
FIGS. 1-4 are edge-on views of several successive steps in the method according to to applicant's invention for improving the front-to-back alignment in the fabrication of burrus LED's.
Figure 2:
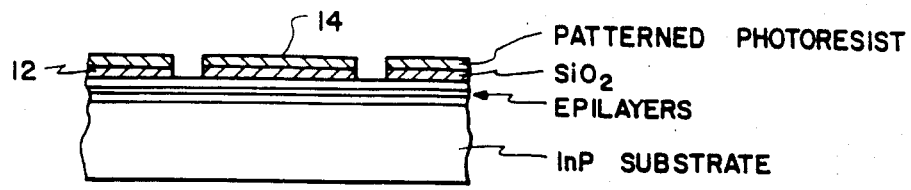
Figure 3:
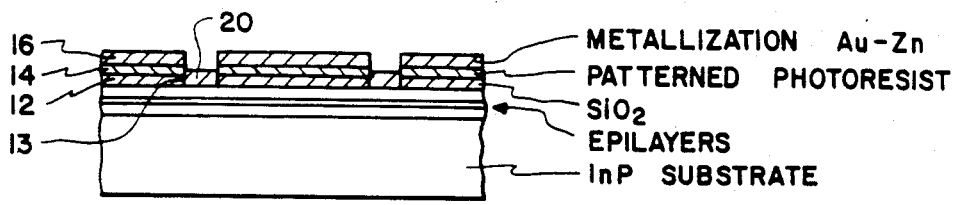
Figure 4:
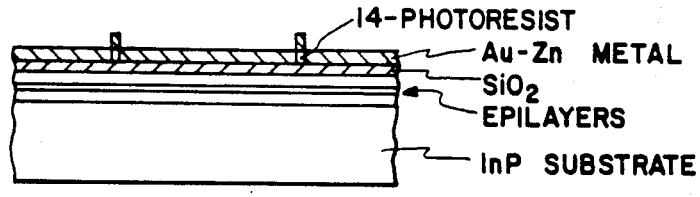
Figure 5:
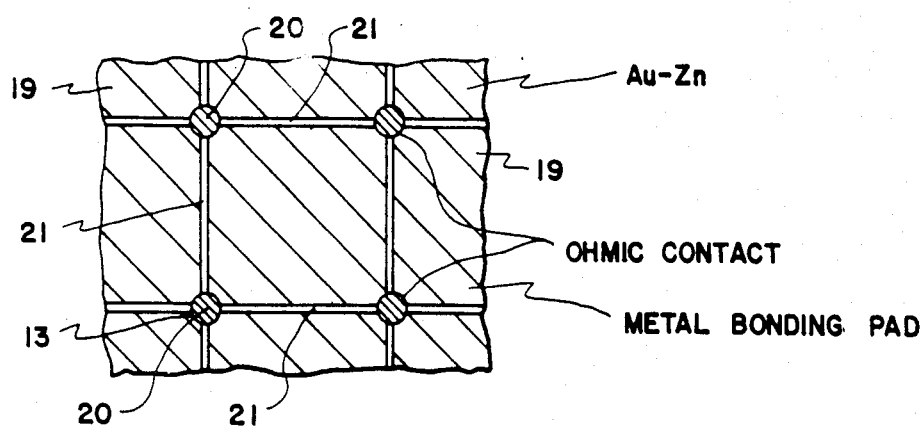
FIG. 5 is a plan view of the front-side showing a plurality of LED contacts, the metal bonding pad and the alignment marks.

Referring now to the edge view FIG. 1 there is shown a semiconductor wafer which has a p-n junction on the front surface thereof. Specifically shown is an InP substrate 10 having thereon multiple expitaxial layers 11 on which it is desired to fabricate a plurality of surface emitting devices such as burrus LED's. In this process a 2000 Å thick silicon dioxide ($SiO_2$) layer 12, that is, an insulating layer, is first deposited on the epitaxial layers and 50 micron diameter holes 13 are etched 625 microns apart in the oxide layer. A photoresist mask 14 for a subsequent metallization step is deposited over the $SiO_2$ and patterned to expose the holes 13 and to provide a mask for complete metallization of the surface except for narrow channels (alignment indicia) which appear as a striped intersecting grid centering on the holes (FIG. 2). In the next step about 3000 Å of metallization Au-Zn 16 is sputter deposited on the upper surface of the device through the photoresist mask. FIG. 3 shows the metallization deposit at the position of the contact holes, and FIG. 4 shows the general metallization of the front surface with the narrow channels defined by the photoresist. The photoresist 14 is then stripped off removing the undesired metal exposing the channels free of metal. The plan view, FIG. 5, shows the top surface metallization layer 19 including the 50 micron diameter ohmic contacts 20 at holes 13 together with the 12 micron wide interconnecting grid of perpendicular metal free strips or channels 21. Thus the metal that deposits inside the 50 micron diameter holes forms the ohmic contact to the device while the metal 19 outside the hole forms the bonding pad. These thin perpendicular metal free channels 21 form a grid pattern which is the crux of the front-to-back alignment process being described.

Figure 6:
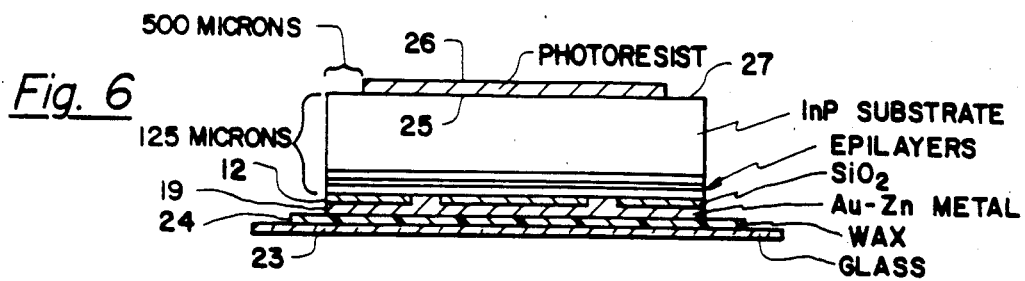
FIGS. 6 and 7 show additional edge-on views of successive steps including etching away of perimeter substrate to expose the top metallization pattern.

Following the top metallization step, the wafer 10 is thinned from the substrate backside to a total thickness of about 125 microns as shown in FIG. 6. The wafer is then temporarily fastened or attached, with the bonding pads 19 and grid lines 21 down (i.e. the top metallized surface down) on a support such as a glass slide 23 using a layer of heated quartz sticky wax 24 to secure the wafer. The back surface 25 of the wafer is then coated with photoresist 26 leaving a perimeter area 27 of width 500 microns or a portion thereof left uncoated. The wafer mounted on the slide is then immersed into a chemical etch to etch away the 125 microns thickness of 500 micron wide area left uncoated along the perimeter. The chemical etch preferably consists of 1:1:1 by volume of HBr, $CH_3COOH$ and $K_2Cr_2O_7$.

Figure 7:
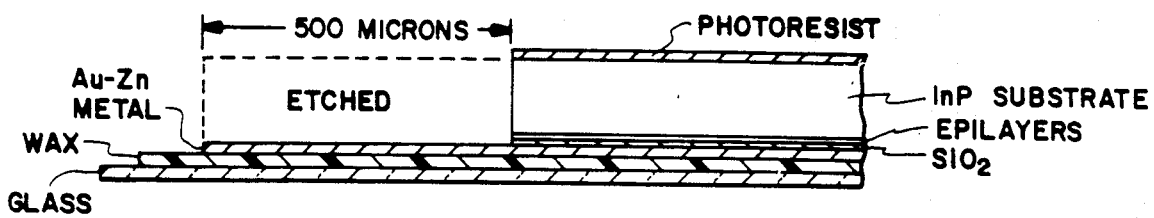
Figure 8:
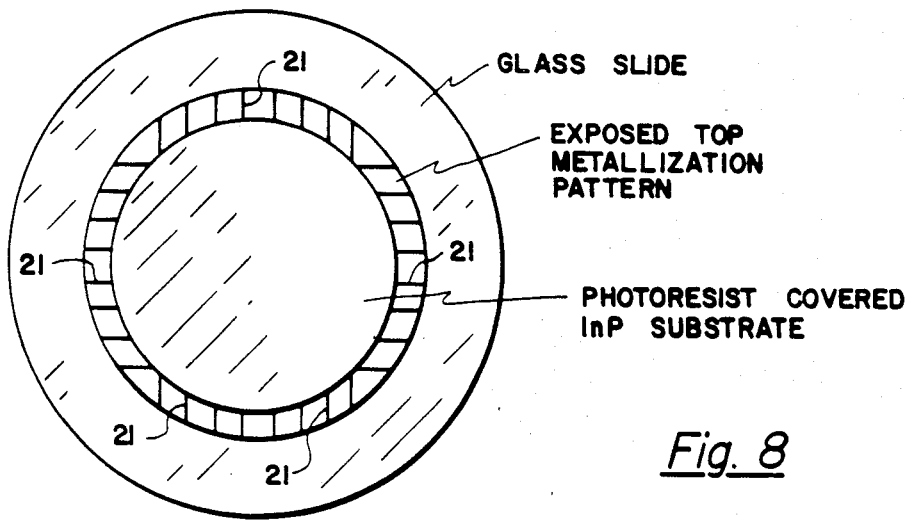
FIG. 8 shows a plan view of the wafer front waxed to a glass slide.

This etching process which etches away the edge of the wafer reveals the end portions of the metal grid pattern (the alignment indicia) on the front surface, now uncovered and still stuck to the wax, FIG. 7. In these exemplary FIGS. 1-6 the relative dimensions of the various layers have been exaggerated and not been shown to scale but merely to be better described in an orderly fashion. In FIG. 7 the relative magnitudes of 500 micron vs. 125 micron thickness in the etched area have been changed from that of FIG. 6 to be more representative of the etched perimeter. Also in figures such as FIG. 5 there has been shown four ohmic contacts 20, however, in practice the number of contacts may be many more such as is shown in the plan view of FIG. 8 where the exposed top metallization pattern has many more intersecting grid lines 21, with an ohmic contact at each intersection.

Figure 9:
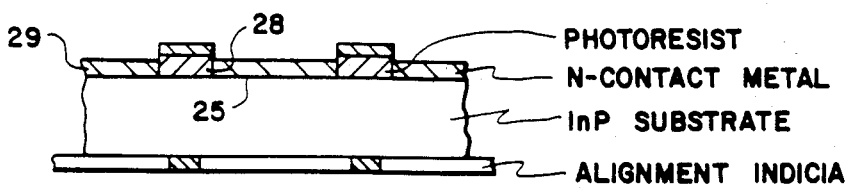
FIGS. 9 and 10 are further edge-on views of method steps to place the contact metal on the wafer backside with the holes in the metallization aligned to the frontside contacts.
Figure 10:
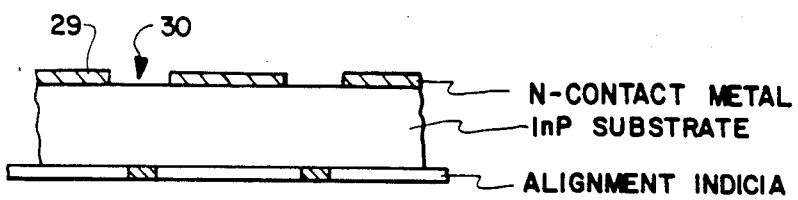
Figure 11:
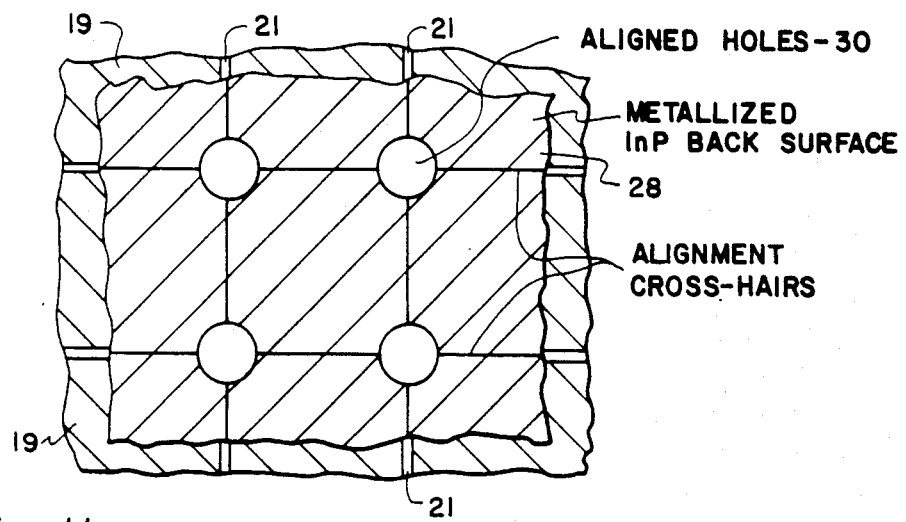
FIG. 11 is a plan view of the metallized back surface with the alignment cross-hairs and the aligned holes.

The back surface contact pattern can now be aligned using the newly exposed part of the top surface grid, i.e. the frontside alignment indicia. To continue the process steps following those described in connection with FIGS. 6-8, the photoresist 26 shown in FIG. 6 is removed from the InP substrate back surface 25, a fresh layer of photoresist is coated on the back surface and patterned with a mask optically aligned with the now visible projecting alignment indicia 21 of the front side. 125 microns wide circular patches of photoresist 28 (FIG. 9) remain after developing and determine the position of the aligned holes. A film of n-contact metal 29 (FIG. 9) is then deposited on the back surface. The n-metal deposited on the photoresist patches is then removed by dissolving away the photoresist, thus exposing 125 microns holes 30 (FIG. 10) in the backside metal contact. In the Burrus LED structure the high intensity light generated in the epitaxial layers under the top ohmic contact 20 is emitted through a hole 30 in the metal contact on the back surface. The maximum intensity of light is generated in the epitaxial layers immediately above the metal contact. It is necessary therefore to have the holes 30 through the metal contact 29 precisely lined up, i.e. concentric, with the metal contacts 20 on the front surface. The hole 30 is the point at which light emanating from the LED is coupled into an optical fiber.

The embodiments of the invention in which an exclusive property or right is claimed are defined as follows:

1. A method for front surface-to-back surface alignment in the fabrication of surface emitting devices on a semiconductor substrate comprising the steps of:
   providing a semiconductor wafer which has a p-n junction on the front surface thereof;
   depositing an insulating layer onto the front surface; forming a pattern of contact holes through the insulating layer wherever it is desired to fabricate said device;
   depositing a layer of photoresist over said insulating layer;
   forming in said photoresist a pattern of contact holes and intersecting indicia marks extending to the perimeter of said wafer, which indicia marks are aligned with said contact holes on said layer of photoresist, whereby said photoresist is removed except at said indicia marks;
   depositing metal into the contact holes and onto the surface of the insulating layer and the patterned photoresist, and thereafter stripping the remaining photoresist and the metal thereon and thereby forming said indicia marks in said metallized surface and extending to the perimeter of said wafer;
   temporarily fastening down said wafer metallized surface to a support;
   removing a wafer edge portion to expose and make visible from the back surface said front surface alignment indicia;
   depositing a layer of photoresist on the back surface;
   providing a back surface mask which has indicia marks and a pattern to define the location of light emitting holes;
   aligning the back surface indicia marks to the front surface alignment indicia marks; exposing and developing the photoresist, and metallizing the back surface of said wafer so that the holes in said back surface metallization are concentric with the front surface contacts.

2. The method according to claim 1 in which the semiconductor wafer is InP.

3. The method according to claim 1 in which the semiconductor wafer has epitaxial layers on the front surface.

4. The method according to claim 1 in which the insulating layer is of $SiO_2$.

5. The method according to claim 1 in which the step of forming the contact holes is by etching.

6. The method according to claim 1 in which the step of removing a wafer edge portion comprises etching away portions of the wafer edge at the alignment indicia marks.

7. A method for front surface-to-back surface alignment in the fabrication of Burrus LED's on a substrate wafer comprising the steps of:
   providing a semiconductor wafer which has epitaxial layers on the front surface thereof;
   depositing a layer of $SiO_2$ onto the epitaxial front surface;
   etching a pattern of contact holes through the $SiO_2$ layer wherever it is desired to fabricate a LED;
   depositing a layer of photoresist over said $SiO_2$ layer;
   providing over said photoresist a mask pattern having contact holes and intersecting alignment indicia lined up with said contact holes;
   exposing and developing said photoresist;
   depositing metal into the contact holes to form front surface contacts and onto the surface of the $SiO_2$ layer and to form a metallized surface;
   stripping said mask pattern and unwanted metal to form marks of said perpendicular alignment indicia on said metallized surface, the marks extending to the perimeter of said wafer;
   temporarily fastening down said wafer metallized surface to a support;
   coating resist on the back surface of said wafer leaving a perimeter of said surface uncoated and exposed;
   etching away the exposed perimeter of said wafer to expose and make visible the perimeter of said front surface metallization from the back surface;
   providing a back surface mask which has indicia marks and a pattern to define the location of light emitting holes in subsequent metallization;
   aligning said back surface mask to the indicia marks of the front surface metallization and metallizing the back surface of said wafer so that the holes in said back surface metallization are concentric with the front surface contacts.

8. The method according to claim 1 in which the surface emitting device is a Burrus LED.

* * * * *